(12) United States Patent
Van Bokhoven et al.

(10) Patent No.: US 10,509,333 B2
(45) Date of Patent: Dec. 17, 2019

(54) PATTERNING DEVICE COOLING APPARATUS

(71) Applicant: ASML NETHERLANDS B.V., Veldhoven (NL)

(72) Inventors: Laurentius Johannes Adrianus Van Bokhoven, Veldhoven (NL); Ruud Hendrikus Martinus Johannes Bloks, Helmond (NL); Günes Nakiboglu, Eindhoven (NL); Marinus Jan Remie, Eindhoven (NL); Johan Gertrudis Cornelis Kunnen, Weert (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/289,875

(22) Filed: Mar. 1, 2019

(65) Prior Publication Data
US 2019/0196345 A1 Jun. 27, 2019

Related U.S. Application Data

(63) Continuation of application No. 16/061,043, filed as application No. PCT/EP2016/078335 on Nov. 21, 2016, now Pat. No. 10,222,713.

(30) Foreign Application Priority Data

Dec. 17, 2015 (EP) .................................... 15200652

(51) Int. Cl.
*G03F 7/20* (2006.01)
(52) U.S. Cl.
CPC ...... *G03F 7/70875* (2013.01); *G03F 7/70716* (2013.01); *G03F 7/70783* (2013.01); *G03F 7/70858* (2013.01); *G03F 7/70933* (2013.01)

(58) Field of Classification Search
CPC ............. G03F 7/70773; G03F 7/70783; G03F 7/70858; G03F 7/70875; G03F 7/70891
(Continued)

(56) References Cited

U.S. PATENT DOCUMENTS 6,153,877 A 11/2000 Ashida
10,222,713 B2 * 3/2019 Van Bokhoven ... G03F 7/70858
(Continued)

FOREIGN PATENT DOCUMENTS

| JP | 10-289874 | 10/1998 | |
|---|---|---|---|
| KR | 10-2006-0003190 | 1/2006 | |
| WO | WO-2014067802 A1 * | 5/2014 | ......... G03F 7/70716 |

OTHER PUBLICATIONS

International Search Report dated Mar. 10, 2017 issued in corresponding International Application No. PCT/EP2016/078335.

*Primary Examiner* — Colin W Kreutzer
(74) *Attorney, Agent, or Firm* — Pillsbury Winthrop Shaw Pittman, LLP

(57) ABSTRACT

An apparatus and method for controlling temperature of a patterning device in a lithographic apparatus, by flowing gas across the patterning device. A patterning apparatus includes: a patterning device support structure configured to support a patterning device; a patterning device conditioning system including a first gas outlet configured to provide a gas flow over a surface of the patterning device and a second gas outlet configured to provide a gas flow over a part of a surface of the patterning device support structure not supporting the patterning device; and a control system configured to separately control the temperature of the gas exiting the first and second gas outlets such that the gas exiting the second gas outlet is at a higher temperature than the gas exiting the first gas outlet and/or to separately control the temperature and gas flow rate of the gas exiting the first and second gas outlets.

20 Claims, 6 Drawing Sheets

(58) Field of Classification Search
USPC .................................... 355/30, 67, 72, 77
See application file for complete search history.

(56) References Cited

U.S. PATENT DOCUMENTS

| | | |
|---|---|---|
| 2002/0191163 A1 | 12/2002 | Hasegawa et al. |
| 2011/0058151 A1* | 3/2011 | Takenaka .............. G03F 9/7011 355/53 |
| 2014/0111782 A1 | 4/2014 | Park |
| 2015/0241796 A1 | 8/2015 | Ebert, Jr. et al. |
| 2017/0363973 A1 | 12/2017 | Venturino |

* cited by examiner

PATTERNING DEVICE COOLING APPARATUS

This application is a continuation of U.S. patent application Ser. No. 16/061,043, filed Jun. 11, 2018, which is the U.S. national phase entry of PCT patent application no. PCT/EP2016/078335, which was filed on Nov. 21, 2016, which claims the benefit of priority of European patent application no. 15200652.4, which was filed on Dec. 17, 2015, each of the foregoing applications is incorporated herein in its entirety by reference.

FIELD

The present disclosure relates to an apparatus and method for controlling temperature of an object, for example, a patterning device in a lithographic apparatus, by flowing gas across a surface of the object.

BACKGROUND

A lithographic apparatus is a machine that applies a desired pattern onto a substrate, usually onto a target portion of the substrate. A lithographic apparatus can be used, for example, to manufacture integrated circuits (ICs). In such a case, a patterning device, for example, a mask or a reticle, can generate a circuit pattern to be formed on an individual layer of the IC. This pattern can be transferred onto a target portion (for example, including part of, one, or several dies) on a substrate (for example, a silicon wafer). Transfer of the pattern is typically via imaging onto a layer of radiation-sensitive material (resist) provided on the substrate. Generally, a single substrate will contain a network of adjacent target portions that are successively patterned. Conventional lithographic apparatuses include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction.

In the lithographic apparatus, the radiation beam may cause thermal effects (e.g., thermal expansion) in the patterning device and more generally in the patterning apparatus. The patterning device may comprise a base material, for example, fused silica, that is substantially transparent to radiation of the radiation beam, for example, deep ultraviolet radiation, and may comprise a pattern made of a substantially non-transparent material, for example, chrome. The thermal effects may be due to absorption of the radiation of the radiation beam by non-transparent portions of the patterning device and may cause, for example, alignment errors and/or overlay errors in the patterns formed on the substrate. To correct these errors due to thermal expansion of the patterning device and/or heating of gas around the patterning device, current lithographic apparatus may rely on known correction systems. For example, such a correction system can include a reticle or wafer alignment system, a magnification correction system, a feed forward system for expansion prediction, a lens correction system, or a combination thereof. However, with the continuing trend towards scaling down of device dimensions, these correction systems may not provide the desired level of alignment and/or overlay accuracy that may be needed for the development of these scaled down devices.

Additionally, radiation of the radiation beam may be incident on a part of a support structure configured to support the patterning device. The support structure may be heated due to absorption of radiation from the radiation beam. Radiation from the radiation beam may also heat the gas around the support structure which may in turn heat the support structure by convection heating. Heat may also be transferred by conduction between the patterning device and the support structure. These modes of heat transferal to or from the support structure can lead to thermal variation which may lead to thermal variation, e.g. expansion, of the support structure. Such thermal expansion can alter the position of the patterning device and may cause, for example, alignment errors and/or overlay errors in the patterns formed on the substrate.

Additionally, measurement systems may be used to align the patterning device. Measurement systems may comprise components and/or marks around the patterning device to measure the location and/or displacement of the patterning device accurately to pattern the radiation beam. The radiation beam, or transfer of heat to or from the patterning device and/or support structure may also heat the gas between the patterning device and the component and/or mark of the measurement system. Such heated gas between the patterning device and the component and/or mark of the measurement system may cause, for example, alignment errors and/or overlay errors in the patterns formed on the substrate. Known correction systems may not adequately account for the errors induced by thermal variation of components and/or marks around the patterning device used to position the patterning device.

SUMMARY

Accordingly, in some embodiments, a system and method controls the temperature of a patterning device and a patterning device support structure.

In some embodiments, a patterning apparatus for a lithographic apparatus comprises a patterning device support structure configured to support a patterning device; a patterning device conditioning system comprising at least one first gas outlet configured to provide a gas flow over a surface of the patterning device and at least one second gas outlet configured to provide a gas flow over a part of a surface of the patterning device support structure not supporting the patterning device; and a control system configured to separately control the temperature of the gas exiting the first gas outlet and the temperature of the gas exiting the second gas outlet such that the temperature of the gas exiting the second gas outlet is at a higher temperature than the gas exiting the first gas outlet.

In some embodiments, a patterning apparatus for a lithographic apparatus comprises: a patterning device support structure configured to support a patterning device; a patterning device conditioning system comprising at least one first gas outlet configured to provide a gas flow over a surface of the patterning device and at least one second gas outlet configured to provide a gas flow over a part of a surface of the patterning device support structure not supporting the patterning device; and a control system configured to control the temperature and gas flow rate of the gas exiting the first gas outlet and separately to control the temperature and gas flow rate of the gas exiting the second gas outlet.

In some embodiments, a device manufacturing method using a lithographic apparatus comprises projecting a beam through a patterning device, wherein the beam is patterned by the patterning device; providing at least one first gas outlet providing a gas flow over the patterning device and at least one second gas outlet providing a gas flow over a part of a surface of the patterning device support structure not supporting the pattern device; controlling the temperature of the gas exiting the first gas outlet; separately controlling the temperature of the gas exiting the second gas outlet at a temperature higher than the temperature of gas exiting the first gas outlet; and directing the beam onto a substrate.

In some embodiments, a device manufacturing method using a lithographic apparatus comprises projecting a beam through a patterning device, wherein the beam is patterned by the patterning device; providing at least one first gas outlet providing a gas flow over a surface of the patterning device and at least one second gas outlet providing a gas flow over a part of a surface of the patterning device support structure not supporting the pattern device; controlling the temperature and gas flow rate of the gas exiting the first gas outlet; separately controlling the temperature and gas flow rate of the gas exiting the second gas outlet; and directing the beam onto a substrate.

Further features and advantages of the embodiments, as well as the structure and operational of various embodiments, are included in the dependent claims and are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

FIG. 40 is a schematic side view illustration of a patterning apparatus, according to the embodiment depicted in FIG. 4A.

Figure 1A:
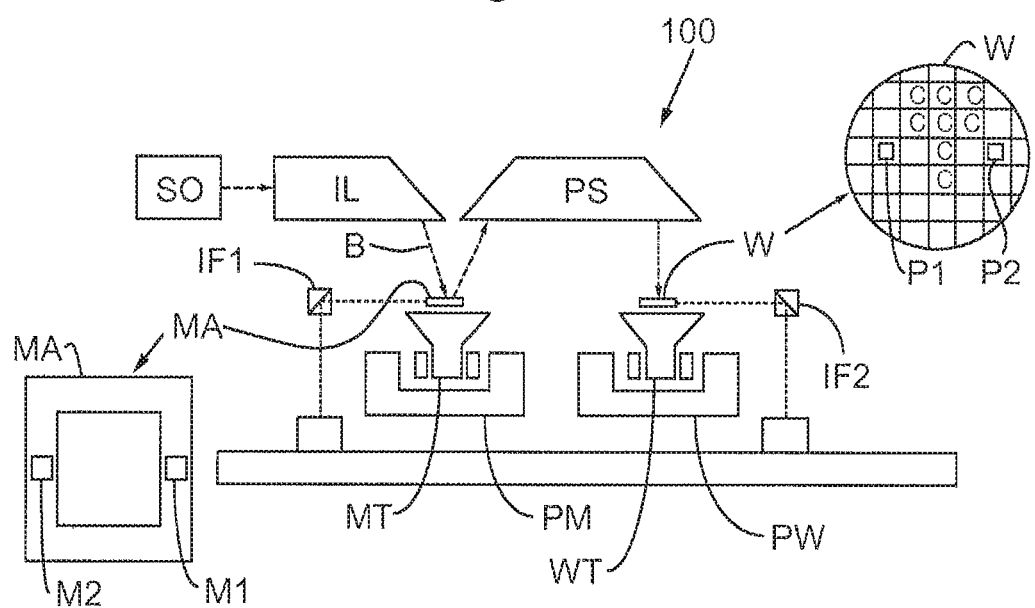
FIG. 1A is a schematic illustration of a reflective lithographic apparatus, according to an embodiment.

The features and advantages of the disclosed embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. Unless otherwise indicated, the drawings provided throughout the disclosure should not be interpreted as to-scale drawings.

DETAILED DESCRIPTION

The disclosed embodiment(s) merely exemplify the invention. The scope of the invention is not limited to the disclosed embodiment(s). The invention is defined by the claims appended hereto.

The embodiment(s) described, and references in the specification to "an example," "one embodiment," "an embodiment," "an example embodiment," "some embodiments," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, characteristic in connection with other embodiments whether or not explicitly described.

Before describing such embodiments in more detail, however, it is instructive to present an example environment in which embodiments of this disclosure may be implemented.

Figure 1B:
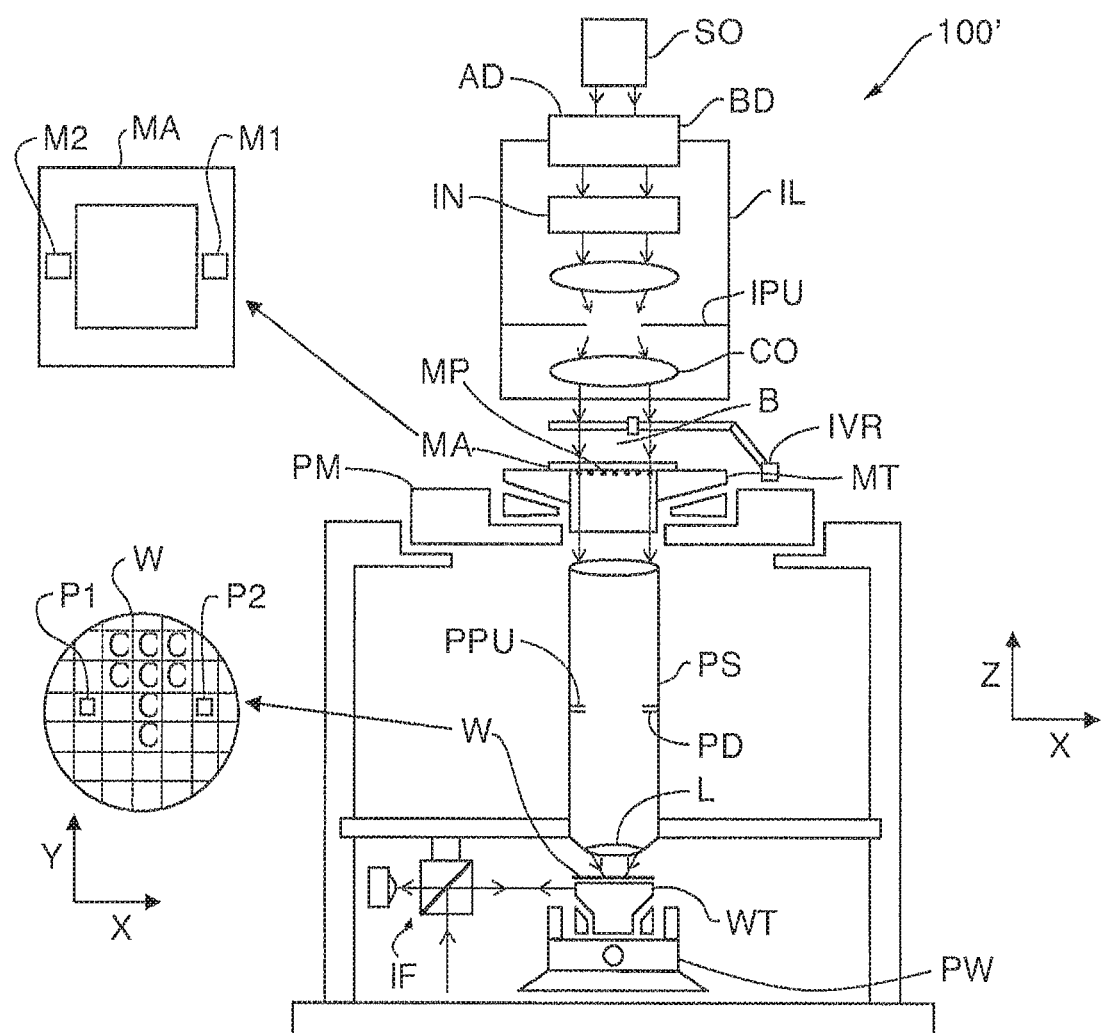
FIG. 1B is a schematic illustration of a transmissive lithographic, apparatus according to an embodiment.

FIGS. 1A and 1B are schematic illustrations of a lithographic apparatus 100 and lithographic apparatus 100', respectively, in which embodiments of this disclosure may be implemented. Lithographic apparatus 100 and lithographic apparatus 100' each include the following: an illuminator (illumination system) IL configured to condition a radiation beam B (for example, ©UV or EUV radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (for example, comprising part of one or more dies) C of the substrate W. In lithographic apparatus 100, the patterning device MA and the projection system PS are reflective. In lithographic apparatus 100', the patterning device MA and the projection system PS are transmissive. In some embodiments, the projection system PS is catadioptric.

The illumination system IL may include various types of optical components, such as refractive, reflective, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA, the design of the lithographic apparatuses 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. The support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two or more tables (or stage(s) or support(s)), e.g., two or more substrate tables (or mask tables) or a combination of one or more substrate tables and one or more sensor or measurement tables configured to measure properties of the projection system PS and not configured to hold a substrate W. In such "multiple stage" machines, the additional substrate tables WT can be used in parallel, or preparatory steps can be carried out on one or more tables while one or more other substrate tables WI are being used for exposure.

Referring to FIGS. 1A and 1B, the illuminator IL receives a radiation beam B from a radiation source SO. The source SO and the lithographic apparatuses 100, 100' can be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate VV. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device MA (for example, mask), which is held on the support structure MT (for example, mask table), and is patterned by the patterning device MA. Having traversed the mask, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern create an image of the intensity distribution at the illumination system pupil IPU.

With the aid of the second positioner PW and position sensor IF (for example, an interferometric device, linear encoder; or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask with respect to the path of the radiation beam B (for example, after mechanical retrieval from a mask library or during a scan).

In general, movement of the mask table can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table can be connected to a short-stroke actuator only or can be fixed. Mask and substrate W can be aligned using mask alignment marks M1, M2, and substrate alignment marks P1, P2. Although the substrate alignment marks (as illustrated) occupy dedicated target portions C, they can be located in spaces between target portions (known as scribe-lane alignment marks). Similarly, in situations in which more than one die is provided on the mask, the mask alignment marks M1, M2 can be located between the dies.

Mask table and patterning device MA can be in a vacuum chamber, where an in-vacuum robot IVR can be used to move patterning devices MA such as a mask in and out of vacuum chamber. Alternatively, when mask table and patterning device MA are outside of the vacuum chamber, an out-of-vacuum robot can be used for various transportation operation, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatuses 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WI is moved or scanned while a pattern imparted to the radiation beam B is projected onto a target portion C. A pulsed radiation source SO can be employed and the programmable patterning device is updated as required after each movement of the substrate table WI or in between successive radiation pulses during a scan. This mode of operational can be readily applied to maskless lithography that utilizes a programmable patterning device, such as a programmable mirror array of a type as referred to herein.

Combinations and/or variations on the described modes of use or entirely different modes of use can also be employed.

Figure 2:
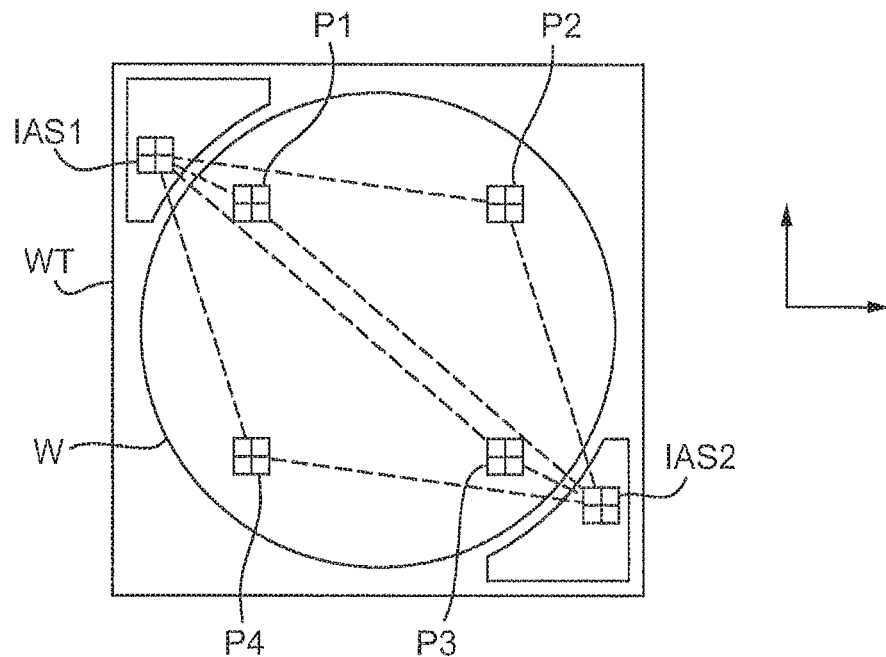
FIG. 2 is a schematic plan view of a substrate table and substrate according to an embodiment.

FIG. 2 schematically depicts an arrangement of substrate table WT depicted in the lithographic apparatuses of FIG. 1A or 1B, according to an embodiment in which substrate table WT includes an image sensor. In some embodiments, as shown in FIG. 2, substrate table WT includes two image sensors IAS1 and IAS2. Image sensors IAS1 and IAS2 can be used to determine a location of an aerial image of a pattern, e.g., an object mark such as mask alignment marks M1, M2, on mask by scanning the image sensor IAS1 or IAS2 through the aerial image. The relative position of object marks on the mask with respect to the wafer table WT can be deduced from information obtained with the image sensors IAS1, IAS2, and a number of parameters can be calculated from the measured positions of object marks on the mask. For example, such parameters of mask can include magnification of the MA (M), rotation about the z axis (R), translation along the x axis and the y axis of mask (Cx, Cy), magnification in the y direction (My), and scan skew (RI).

It must be understood that instead of two image sensors IAS1 and IAS2, more or fewer image sensors may be present, e.g. one or three. The form of these sensors and electronics is known to the skilled person and will not be described in further detail. Alternative forms of alignment mechanism are possible, and useful within the scope of the present invention. In other embodiments, it may be possible to dispense with image sensors IAS1, IAS2, or to provide them on a support separate from the substrate table which carries the substrate.

Although specific reference can be made in this text to the use of lithographic apparatus in the manufacture of ICs, it should be understood that the patterning apparatus and lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example, in order to create a multi-layer IC, so that the term substrate used herein can also refer to a substrate that already contains one or multiple processed layers.

Although specific reference may have been made above to the use of embodiments in the context of optical lithography, it will be appreciated that the embodiments may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "lens," where the context allows, may refer to any one or combination of various types of optical components, including refractive, reflective, magnetic, electromagnetic and electrostatic optical components.

Known patterning apparatus may provide a gas flow over a surface of a patterning device to in some way alter or control the temperature of the patterning device to reduce errors induced by thermal variation of the patterning device and/or patterning device support structure (herein after referred to simply as support structure). Known patterning apparatus may have control of said gas flow to control and reduce the effects of thermal variation. However, there is still a problem that the control provided does not adequately reduce errors induced by thermal variation of the patterning device. First, temperature of the support structure is not adequately accounted for. Second, more specific control may be required than is currently available to account for the thermal variation in plan surface of the patterning device. In particular, thermal variation over the top of the patterning device, e.g. across its width, may not be accounted for using known temperature control systems. Additionally, known systems do not necessarily directly control thermal variation of the support structure which supports the patterning device. Furthermore, the support structure may also comprise or support a mark and/or component of a measuring system used accurately to position the patterning device. Therefore, any thermal variations which affect this mark and/or component will affect the positioning of the patterning device and thus lead to errors such as overlay error. As such, it is beneficial to control the temperature of any areas surrounding the patterning device which may affect thermal variation of the mark and/or component of such a measuring system. Therefore, the present invention provides a patterning apparatus configured to control temperature of at least the patterning device, the patterning apparatus comprising a conditioning system with gas outlets as described below.

Figure 3:
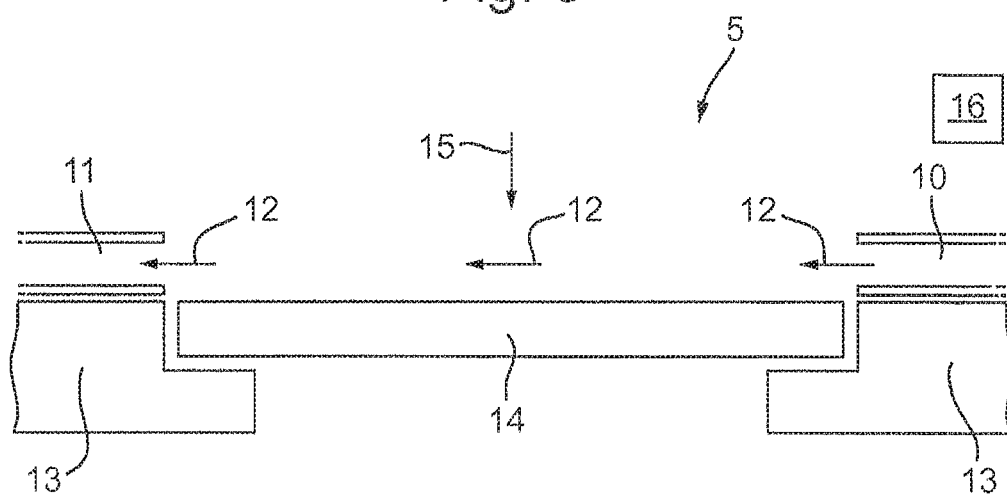
FIG. 3 is a schematic side view illustration of a patterning apparatus, according to an embodiment.

FIG. 3 is a schematic side view of a patterning apparatus 5, comprising a support structure 13 configured to support a patterning device 14. The support structure 13 may be the same as the support structure MT (for example, the mask table) as described in relation to FIGS. 1A and 1B, and can otherwise be referred to as a patterning device support structure. The support structure 13 is configured to support the patterning device 14. The patterning device 14 may be the same as the patterning device MA (for example, a mask, a reticle or a dynamic patterning device, etc.) as described in relation to FIGS. 1A and 1B. A radiation beam 15 may be directed to the patterning device 14, such that the patterning device 14 can be used to impart a pattern to the radiation beam 15. The radiation beam 15 may be the same as the radiation beam B (for example, DUV or EUV radiation) as described in relation to FIG. 1A or 1B. Generally, the radiation beam 15 is reflected from, or passes through, the patterning device 14. Thus, the radiation beam 15 is generally incident on a surface of the patterning device 14. This surface of the patterning device 14 may be heated by the radiation beam 15. Thus a temperature variation is introduced to the patterning device 14. The radiation beam 15 and/or temperature variation of the patterning device 14 may heat the gas around the patterning device 14 and/or support structure 13.

The support structure 13 may use mechanical, vacuum, electrostatic, or other clamping techniques to hold the patterning device 14 in place, and/or optionally to hold the patterning device 14 to a support table (not shown in FIG. 3) that directly supports the patterning device 14 on the support structure 13. The support structure 13 may be configured to ensure that the patterning device 14 is at a specific position, for example with respect to other components outside of the patterning apparatus 5. For example, the support structure 13 can include a moveable component such as a short and/or long stroke module, that is configured accurately to position the patterning device 14 (e.g. along the x-axis and/or the y-axis). The support structure 13 can be any appropriate shape to support the patterning device 14 and may have an opening beneath the patterning device 14 as shown in the Figures, or may be solid beneath the patterning device 14 (not shown). The support structure 13 may support the patterning device 14 on a surface of the support structure 13. The surface of the support structure 13 may be a planar surface. Alternatively, the support structure 13 may have a recess in which the patterning device 14 is positioned. The recess may optionally be an opening in the support structure 13. The surface around the recess and/or around the patterning device 14, may be exposed to temperature variations due to the surrounding air which may be in contact with the surface of the support structure 13 and/or any radiation from the radiation beam 15 which may be incident on the surface of the support structure 13.

Figure 4A:
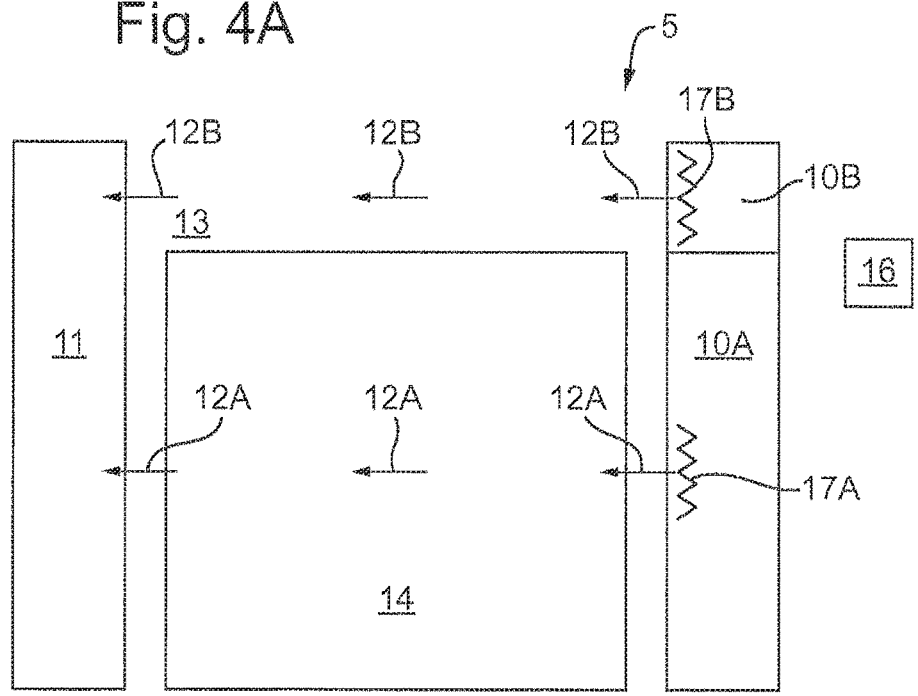
FIG. 4A is a schematic plan view illustration of a patterning apparatus, according to another embodiment.
Figure 4B:
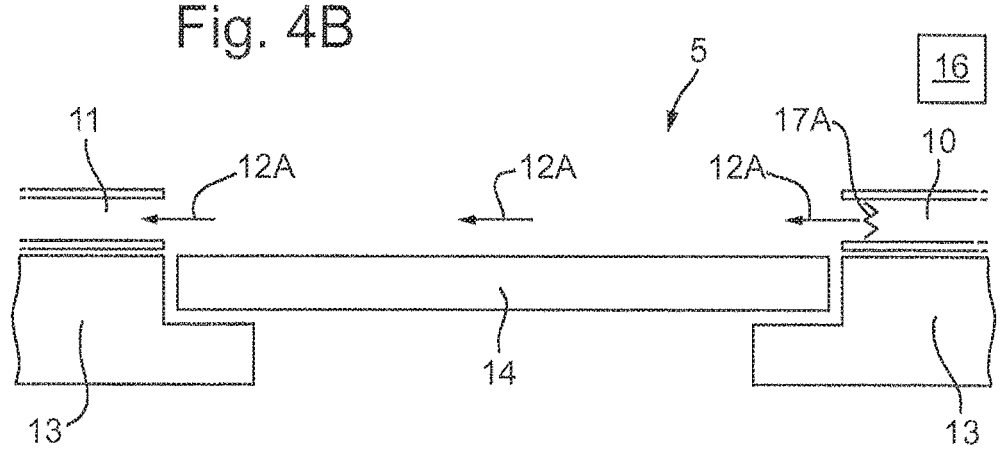
FIG. 4B is a schematic side view illustration of a patterning apparatus, according to the embodiment depicted in FIG. 4A.

The patterning apparatus 5 further comprises a patterning device conditioning system, which may otherwise be referred to as the conditioning system. The conditioning system comprises gas outlets 10, depicted from a side view in FIG. 3. The gas outlets 10 are configured to provide a gas flow 12 over the patterning device 14 and the patterning support structure 13. In an embodiment, the conditioning system comprises at least one first gas outlet 10A, and at least one second gas outlet 10B. The at least one first gas outlet 10A may comprise multiple gas outlets. The at least one first gas outlet 10A, from hereon in referred to as the first gas outlet 10A, is configured to provide a gas flow 12A over a surface of the patterning device 14, as depicted in FIGS. 4A and 4B. The at least one second gas outlet 10B, from hereon in referred to as the second gas outlet 10B, is configured to provide a gas flow 12B over at least a part of a surface of the support structure 13, as depicted in FIGS. 4A and 40. The at least part of the surface of the support structure 13 may be the surface surrounding the patterning device 14 and/or the surface surrounding the recess in which the patterning device 14 is positioned. The at least one of a second gas outlet 10B may comprise multiple gas outlets.

It will be understood that the terminology relating to the first, the second and so on is interchangeable and is used merely to identify which gas outlet is being referred to. Reference to the gas outlets 10 is used for convenience to refer to the first gas outlet 10A and the second gas outlet 10B as well as any other gas outlets which may be included. Reference to the gas flow 12 is used for convenience to refer to the total gas flow provided by the gas outlets 10. Although the gas flow 12 is depicted as individual arrows in the Figures, the width of the first gas flow 12A and the second gas flow 12B will be determined by each of the gas outlets, e.g. gas outlet 10A and gas outlet 10B respectively. This applies to any additional gas flows provided from any additional gas outlets.

The gas flow 12 may be a laminar gas flow. The width of the gas flow 12 as it travels across the patterning device 14 or surrounding areas such as the support structure 13 may be at substantially the same width as when it exits its respective gas outlet 10. The gas flow 12 may be substantially dehumidified gas. The gas flow 12 may comprise extremely clean gas or air, or may consist essentially of extremely clean gas or air. The gas flow 12 may comprise, or may consist essentially of extremely clean dry air (i.e. filtered and dehumidified air sometimes referred to as XCDA). The gas flow 12 may comprise carbon dioxide, helium, argon, nitrogen and/or hydrogen. The gas flow 12 may consist essentially of carbon dioxide, helium, argon, nitrogen or hydrogen. The gas flow 12 may comprise or be a combination of at least one of these gases. The gas flow 12 may be temporarily or selectively stopped while the patterning device 14 is loaded on or unloaded from the support structure 13 to avoid disturbing the loading process. In some embodiments, the gas flow 12 can be temporarily and selectively stopped when no cooling of the patterning device 14 is required.

As depicted in FIG. 4A, the first gas outlet 10A is positioned and configured to generate the first gas flow 12A that travels across a surface of the patterning device 14. The second gas outlet 10B is positioned and configured to generate the second gas flow 12B that travels across a surface of the support structure 13. The first gas outlet 10A may be positioned to generate a gas flow 12A that travels across a first surface of the patterning device 14 on which the radiation beam 15 impinges. The second gas outlet 10B may be positioned to generate a gas flow 12B that travels across a second surface of the support structure 13. The second surface may be a part of surface of the support structure 13 around the patterning device 14 and/or around a recess in the support structure 13 (if present) when viewed in plan. In some embodiments, the gas flow 12 from gas outlets 10 travels substantially parallel to the surface of the patterning device 14, as depicted in FIG. 3.

The patterning apparatus 5 further comprises a control system 16 configured to control separately at least one parameter of the gas exiting the first gas outlet 10A and the gas exiting the second gas outlet 10B. In other words, at least one parameter of the gas exiting the first gas outlet 10A and the gas exiting the second gas outlet 10B is individually controlled. Thus, the control system 16 controls the first gas outlet 10A and the second gas outlet 10B independently. The control system 16 is configured to control the temperature of the gas exiting the first gas outlet 10A and to separately control the temperature of the gas exiting the second gas outlet 10B. In this way, the control system 16 may provide gas from each of the first gas outlet 10A and the second gas outlet 10B at predetermined temperatures. The control system 16 may be configured to control additional parameters of the gas exiting the gas outlets 10, for example, gas flow rate or gas humidity.

If the conditioning system comprises multiple first gas outlets 10A, the multiple first gas outlets 10A may be controlled together. In other words, it is not necessary to control each of the individual first gas outlets 10A separately e.g. the first gas outlets 10A may comprise multiple, connected openings. If the conditioning system comprises multiple second gas outlets 10B, the multiple second gas outlets 10B may be controlled together. In other words, it is not necessary to control each of the individual second gas outlets 10B separately e.g. the second gas outlets 10B may comprise multiple, connected openings.

As described above, as the radiation beam 15 is directed to the patterning device 14, it heats the patterning device 14 on which the radiation beam 15 is incident. This in turn may also heat any gas around the patterning device 14, thus affecting the temperature of the gas around the patterning device 14 and/or the support structure 13. In known systems, a gas flow may be provided over the first surface of the patterning device 14 to control the temperature (generally to reduce the temperature) of the patterning device 14 in order to reduce the thermal variation induced by radiation from the radiation beam 15 and thus to reduce or avoid errors as a result of this thermal variation. However, in many cases, this control is not adequate to reduce these errors to an acceptable degree. This is partly because thermal variation in the patterning device 14 due to the radiation beam 15 is unlikely to be uniform. The radiation beam 15 will likely be mainly or entirely incident upon the patterning device 14 rather than the support structure 13. Therefore, the patterning device 14 will likely be heated by radiation of the radiation beam 15 but the support structure 13 will not be heated, or may be heated to a lesser degree. Thermal variation of the support structure 13 may also occur due to conduction of heat from the patterning device 14. Therefore, there is need for a way of further controlling the thermal variation of the patterning apparatus 5 as a whole.

Providing a first gas outlet 10A and a second gas outlet 10B which can be separately controlled allows the temperature of gas exiting the first gas outlet 10A and the second gas outlet 10B to be set to different values. This means that temperature control of the patterning device 14 and the support structure 13 can be controlled more accurately to account for the thermal variation of different parts of the patterning apparatus 5, which is likely to be non-uniform.

In an embodiment, the control system 16 is configured to control the temperature of the gas exiting the second gas outlet 10B at a temperature higher than the temperature of the gas exiting the first gas outlet 10A. In other words, the control system 16 is configured to control gas exiting over the surface of the support structure 13 to be at a temperature higher than gas exiting from a gas outlet over at least a part of the surface of the patterning device 14.

As described above, the thermal variation across the patterning device 14 and the support structure 13 may not be uniform. As the patterning device 14 is exposed to the radiation beam 15, it is likely to be heated more than the support structure 13. The patterning device 14 may be at a different temperature to the support structure 13. For example, the patterning device 14 may be at a higher temperature than the support structure 13 due to heating by radiation from the radiation beam 15. Therefore, separately controlling the temperature of each of the first gas outlet 10A and the second gas outlet 10B allows this difference to be accounted for. Furthermore, controlling the temperature of gas above the support structure 13 to be at a temperature higher than the gas over the patterning device 14 allows the thermal variation to be accounted for. In other words, passing gas over the patterning device 14 at a different temperature to the gas over the support structure 13 means that the overall temperature across the patterning device 14 and the support structure 13 may be uniform (or at least more uniform than it otherwise would be), and thus errors due to thermal variation can be reduced or avoided.

In an embodiment, the control system 16 is configured to control the gas flow rate of the gas exiting the first gas outlet 10A and to control separately the gas flow rate of the gas exiting the second gas outlet 10B. Therefore, the control system 16 may be configured to control the temperature and gas flow rate of the gas exiting the first gas outlet 10A and to separately control the temperature and gas flow rate of the gas exiting the second gas outlet 10B. Additionally, the control system 16 may optionally be configured to control the temperature of the gas exiting the second gas outlet 10B at a temperature higher than the temperature of the gas exiting the first gas outlet 10A as described above.

The gas exiting the gas outlets 10 over the surface of the patterning device 14 and the part of the surface of support structure 13 is depicted as arrows in the Figures. However, the flow will be across the surface (e.g. across the width) of the patterning device 14 and will be determined by each of the gas outlets 10. The second gas flow 12B may have substantially the same width as the second gas outlet 10B. For example, in the patterning apparatus 5 depicted in FIG. 4A, the first gas flow 12A exiting the first gas outlet 10A may have a width substantially the same as the first gas outlet 10A. Thus the first gas flow 12A may have a width substantially the same as the width of the patterning device 14, as shown in FIG. 4A. The second gas flow 12B may have substantially the same width as the second gas outlet 10B.

As the gas flow 12 from each of the first gas outlet 10A and the second gas outlet 10B is individually controlled, it is preferable that the gas flow 12A from the gas first outlet 10A does not mix with the gas flow 12B from the second gas outlet 10B. In other words, in an embodiment, the first gas flow 12A may be substantially separated from the second gas flow 12B. For example, in FIG. 4A, it is preferable if the first gas flow 12A exiting from the first gas outlet 10A does not mix with the second gas flow 12B exiting from the second gas outlet 10B. This may be controlled by separating the gas exiting the first gas outlet 10A and the second gas outlet 10B before the gas exits these respective outlets. Additionally or alternatively, this may also be controlled by separately controlling the gas flow rate of the gas exiting each of the first gas outlet 10A and the second gas outlet 10B. This means that the amount of mixing between the first gas flow 12A and the second gas flow 12B can be reduced or minimized. The first gas flow 12A and the second gas flow 12B may be controlled such that they are laminar gas flows, to reduce mixing between the different gas flows. The gas flow rate of the gas exiting the first gas outlet 10A and the gas flow rate of the gas exiting the second gas outlet 10B may be separately controlled such that the first gas flow 12A has approximately the same speed as the second gas flow 12B. This means that mixing of the first gas flow 12A and the second gas flow 12B can be reduced or minimized, thus the gas will pass over the patterning device 14 or the support structure 13 without the different gas flows affecting one another even if they are adjacent (which may be especially useful if the adjacent flows are of different temperatures). This provides more accurate temperature control of the patterning apparatus 5 as a whole. Furthermore, this also means that the first gas outlet 10A and the second gas outlet 10B may have different sizes and widths and thus different gas flow rates for the exiting gas, however, the gas exiting the first gas outlet 10A and the second gas outlet 10B may still be controlled when travelling over a specific part of the patterning apparatus 5, i.e. the patterning device 14 or the support structure 13. In this way, the speed of the gas flow 12 over the patterning apparatus 5, i.e. across the width of the patterning device 14 and support structure 13 may be controlled to be substantially uniform.

Figure 4C:
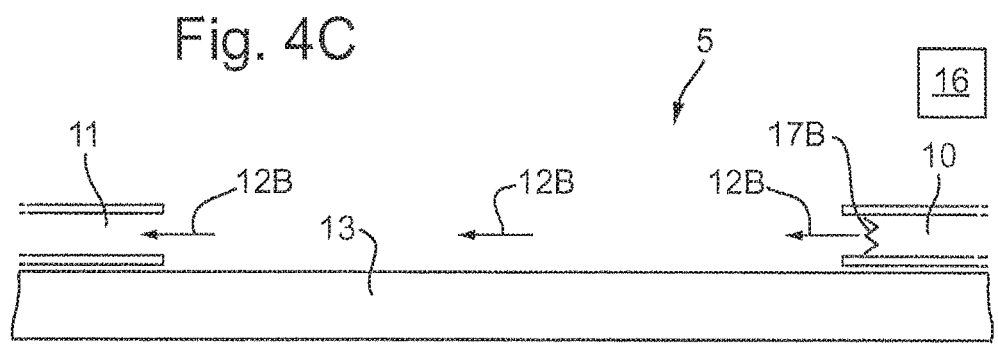
Figure 5:
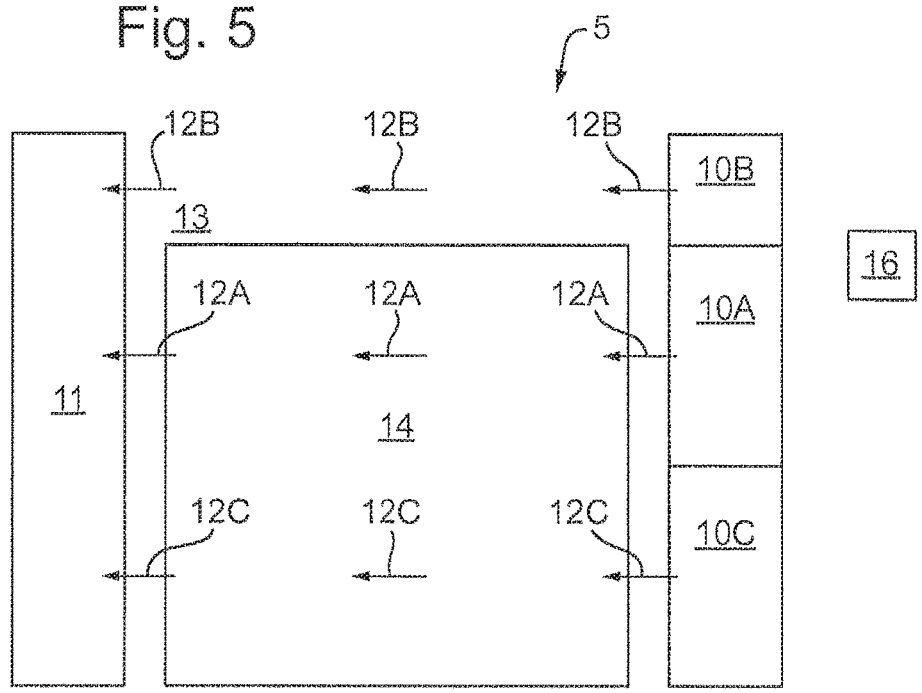
FIG. 5 is a schematic plan view illustration of a patterning apparatus, according to another embodiment.
Figure 6:
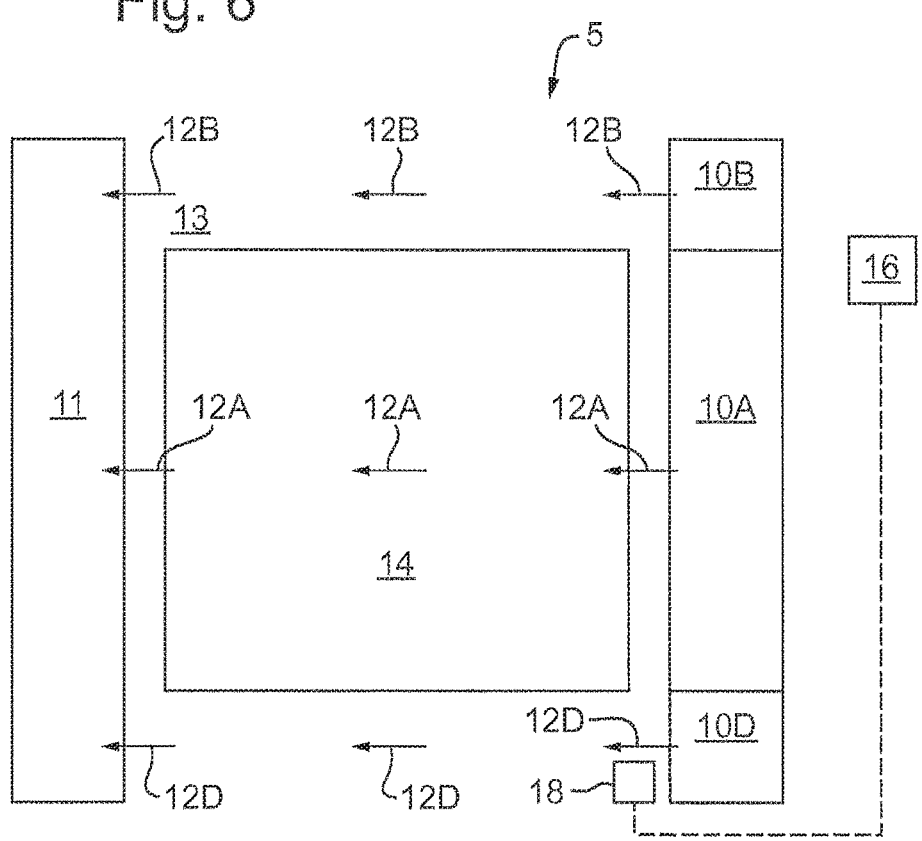
FIG. 6 is a schematic plan view illustration of a patterning apparatus, according to another embodiment.

In an embodiment, the patterning apparatus 5 may further comprise a gas inlet 11, as depicted in FIGS. 3 to 7. The gas inlet 11 is configured to extract gas flow 12. The gas inlet 11 may optionally be included in any of the embodiments, but is not essential to the invention. The gas inlet 11 is positioned and configured to receive the gas flow 12 that travels across the surface of the patterning device 14 and/or the support structure 13, for example as shown in FIGS. 4A, 5 and 6. In some embodiments, gas flow 12 travels substantially from the first gas outlet 10A and the second gas outlet 10B to gas inlet 11. The gas inlet 11 may be positioned on substantially an opposite side of the patterning device 14 from the first gas outlet 10A and the second gas outlet 10B, as shown for example in FIG. 4A. The gas inlet 11 may extract the gas flow 12 as the gas flow 12 reaches the opposite side of the patterning device 14 from the first gas outlet 10A and the second gas outlet 10B. In some embodiments, extraction of the gas flow 12 at the gas inlet 11 can be active or passive. Although the gas inlet 11 is depicted as a single gas inlet, it may comprise any number of gas inlet openings, which may be mechanically and thermally separated, which may affect how the gas is received by the gas inlet 11. The gas inlet 11 may comprise the same number of separate gas inlet openings as the number of independently controlled gas outlets 10.

In an embodiment, the temperature of the gas exiting the first gas outlet 10A and the second gas outlet 10B is controlled between approximately 19° C. to 23° C., preferably between approximately 20.5° C. to 22.5° C., or more preferably between approximately 21° C. to 22° C. In an embodiment, the temperature of the gas exiting the first gas outlet 10A and the second gas outlet 10B is controlled to be less than or equal to approximately 23° C., preferably less than or equal to approximately 22.5° C., or more preferably less than or equal to approximately 22° C. In an embodiment, the temperature of the gas exiting the first gas outlet 10A and the second gas outlet 10B is controlled to be greater than or equal to approximately 19° C., preferably greater than or equal to approximately 20.5° C., or more preferably greater than or equal to approximately 21° C.

In an embodiment, the speed of the gas exiting the first gas outlet 10A and the second gas outlet 10B is controlled between approximately 20 m/s to 50 m/s, preferably between approximately 30 m/s to 45 m/s. In an embodiment, the speed of the gas exiting the first gas outlet 10A and the second gas outlet 10B is controlled to be less than or equal to approximately 50 m/s, preferably less than or equal to approximately 45 m/s. In an embodiment, the speed of the gas exiting the first gas outlet 10A and the second gas outlet 10B is controlled to be greater than or equal to approximately 20 m/s, preferably greater than or equal to approximately 30 m/s.

In any of the above embodiments, gas in the first gas outlet 10A may be mechanically and thermally separated from gas in the second gas outlet 10B, i.e. the gas is separated before exiting the first gas outlet 10A and the second gas outlet 10B. In other words, the gas in one of the gas outlets 10 may be physically separated from gas in other gas outlets which is not the one. For example, each of the gas outlets 10 may comprise a nozzle, wherein each of the first gas outlet 10A and the second gas outlet 10B is formed by a separate nozzle such that the first gas outlet 10A is a first nozzle and the second gas outlet 10B is a second nozzle. The first gas outlet 10A may comprise multiple nozzles which are separately, i.e. independently, controlled from the second gas outlet 10B which may also or alternatively comprise multiple nozzles. Mechanically and thermally separating the gas in the first gas outlet 10A from the gas in the second gas outlet 10B means that the at least one parameter of the gas at each outlet can be separately controlled more easily.

In an embodiment, the gas may be supplied to the gas outlets 10 from a gas source, the gas source (not shown in the Figures) may be the same for the first gas outlet 10A and the second gas outlet 10B. Alternatively, the gas may be supplied from a gas supply system (not shown in the Figures) wherein the first gas outlet 10A and the second gas outlets 10B and/or the second gas outlet 10B may be provided with gas from different gas sources. Either way, the control system 16 is configured to control the gas exiting the gas outlet 10A and the second gas outlet 10B to control at the least the temperature of the gas as described above, and optionally the gas flow rate as well, and optionally any other parameter of the gas.

The conditioning system may optionally comprise heaters 17 in any of the embodiments, as depicted in FIGS. 4A, 4B and 40. The control system 16 may be configured to control the heaters 17. As shown in FIGS. 4A, 4B and 40, the first gas outlet 10A may have a corresponding first heater 17A and the second gas outlet 10B may have a corresponding second heater 17B. The first heater 17A and the second heater 17B may be provided with any useful configuration in the first gas outlet 10A and the second gas outlet 10B respectively which allows the temperature of the gas exiting each of the first gas outlet 10A and the second gas outlet 10B respectively to be controlled as desired. The control system 16 may be used to control separately the first heater 17A and the second heater 17B in order to separately control the temperature of the gas exiting each of the first gas outlet 10A and the second gas outlet 103 respectively. Alternatively, or additionally, gas provided to the gas outlet 10A and the second gas outlet 10B may be provided at a predetermined temperature controlled by the control system 16. For example, the control system 16 may control the heating or cooling of gas at the gas source to provide gas of a certain temperature to at least one of the first gas outlet 10A and the second gas outlet 10B. The heaters 17 are depicted in FIGS. 4A, 4B and 4C but could be used in an embodiment as depicted in any of the other Figures, and/or may not be used in FIGS. 4A to 40 at all.

Although the above description refers to the first gas outlet 10A and the second gas outlet 10B, any number of suitable gas outlets may be used. Therefore, the conditioning system may comprise further gas outlet(s) to provide a further gas flow(s) over the patterning device 14 and/or may comprise further gas outlet(s) to provide a further gas flow(s) over the support structure 13. Therefore, the conditioning system may comprise any number of further gas outlets which are controlled separately, i.e. independently, from the other gas outlets.

In an embodiment, the conditioning system comprises a further gas outlet 10C, as depicted in FIG. 5, configured to provide a further gas flow over the patterning device 14. The further gas outlet 100 may be the same as the first gas outlet 10A as described above, but is separately controlled. In other words, the further gas outlet 100 provides a further separately controlled gas flow 120 over the patterning device 14. In this embodiment, the control system 16 is configured further to control separately at least one parameter of the gas exiting the further gas outlet 100. In other words, the control system 16 is configured to control at least the one parameter of the gas exiting the further gas outlet 100 separately from controlling gas exiting either of the first gas outlet 10A and the second gas outlet 10B.

This might include controlling the temperature of the gas exiting the further gas outlet 100 over the patterning device 14. The control system 16 may be configured to control temperature of the gas exiting the further gas outlet 10C to be at a temperature lower than the temperature of the gas exiting the second gas outlet 10B over the support structure 13. The control system 16 may be configured to control temperature of the gas exiting the further gas outlet 10C to be at a temperature substantially the same as the temperature of the gas exiting the first gas outlet 10A over the patterning device 14. In other words the control system 16 may be configured to control gas exiting different gas outlets over the patterning device 14 to be at the same temperature but to be separately controlled. Optionally, this temperature may be lower than the temperature of gas exiting the second gas outlet 10B over the support structure 13. The control system 16 may be configured to control the temperature of the gas exiting each of the first gas outlet 10A and the further gas outlet 100 at a slightly different temperature, for example to account for the thermal variation across the width of the patterning device 14. Providing plural gas outlets exiting gas over the patterning device 14 which can be independently controlled may have particular benefits in that this provides a certain degree of control of the temperature variation over the width of the patterning device 14. In particular, providing seven gas outlets configured to provide a gas flow over a surface of the patterning device 14, which are each separately controlled, may be beneficial for providing a high degree of control.

Additionally or alternatively, the control system 16 is further configured to control the gas flow rate of the gas exiting the further gas outlet 10C. The control system 16 may control the gas flow rate of the gas exiting the further gas outlet 10C such that the speed of the gas exiting the further gas outlet 10C is substantially the same as the speed of the gas exiting the first gas outlet 10A. The control system 16 may control the gas flow rate of the gas exiting the further gas outlet 100 such that the speed of the gas exiting the further gas outlet 100 is substantially the same as the speed of the gas exiting the second gas outlet 10B. The control system 16 may be configured to control the gas flow rate of the gas exiting the first gas outlet 10A, the second gas outlet 10B and the further gas outlet 100 such that the speed of the gas over the patterning device 14 and the support structure 13 is substantially uniform across the patterning apparatus 5, i.e. to have substantially the same speed across the patterning device 14 and support structure 13.

Alternatively, in an embodiment, the conditioning system comprises a further gas outlet 10D, as depicted in FIG. 6, configured to provide a further gas flow 12D over at least a part of a surface of the support structure 13. The further gas outlet 10D may be the same as the second gas outlet 10B as described above, but is separately controlled. In other words, the further gas outlet 10D provides a further separately controlled gas flow 12D over the support structure 13.

In this embodiment, the control system 16 is further configured to control at least one parameter of the gas exiting the further gas outlet 10D. In other words, the control system 16 is configured to control at least one parameter of the gas exiting the further gas outlet 10D separately from controlling gas exiting either of the first gas outlet 10A and the second gas outlet 10B. This might include controlling the temperature of the gas exiting the further gas outlet 10D over the support structure 13. The control system 16 may be configured to control temperature of the gas exiting the further gas outlet 10D at a temperature higher than the temperature of the gas exiting the first gas outlet 10A over the patterning device 14. The control system 16 may be configured to control temperature of the gas exiting the further gas outlet 10D at a temperature substantially the same as the temperature of the gas exiting the second gas outlet 10B over the support structure 13. In other words, the control system 16 may be configured to control gas exiting different gas outlets over the support structure 13 to be at the same temperature but to be separately controlled. Optionally, this temperature may be higher than the temperature of gas exiting the first gas outlet 10A over the patterning device 14.

Additionally or alternatively, the control system 16 is further configured to control the gas flow rate of the gas exiting the further gas outlet 10D. The control system 16 may control the gas flow rate of the gas exiting the further gas outlet 10D such that the speed of the gas exiting the further gas outlet 100 is substantially the same as the speed of the gas exiting the second gas outlet 10B. The control system 16 may control the gas flow rate of the gas exiting the further gas outlet 10D such that the speed of the gas exiting the further gas outlet 10D is substantially the same as the speed of the gas exiting the first gas outlet 10A. The control system 16 may be configured to control the gas flow rate of the gas exiting the first gas outlet 10A, the second gas outlet 10B and the further gas outlet 10D such that the speed of the gas over the patterning device 14 and the support structure 13 is substantially uniform patterning apparatus 5, i.e. to have substantially the same speed across the patterning device 14 and support structure 13.

The further gas outlet 10C of FIG. 5 and the further gas outlet 10D of FIG. 6 are optional and may be alternatively provided or may be provided in the same embodiment. Each of these gas outlets indicates that additional gas outlets may be included to provide further gas flows over each of the patterning device 14 or the support structure 13 which are further separately controlled. There may in fact be any reasonable number of gas outlets over the patterning device 14. For example, there may be 1, 2, 3, 4, 5, 6, 7 or more separately controlled gas outlets which correspond to the first gas outlet 10A, as described above, to provide gas flows over the patterning device 14. The control system 16 may be configured to control the gas exiting each of the gas outlets over the patterning device 14. The control system 16 may be configured to control each of the gas outlets exiting gas over the patterning device 14 at the same temperature. Alternatively, the control system 16 may be configured to control the temperature of the gas exiting each of these gas outlets at a slightly different temperature, for example to account for the thermal variation across the patterning device 14. The plural gas outlets may have substantially uniform widths. These gas outlets may be aligned with each other. These gas outlets may be aligned along an edge of the patterning device 14, for example as depicted in FIG. 5. The total combined width of the gas outlet(s) providing gas over the patterning device 14 may be substantially the same as the width of the patterning device 14.

Additionally, there may be any reasonable number of gas outlets corresponding to the second gas outlet 10B over the support structure 13. For example, there may be 1, 2, 3, 4, 5, 6, 7 or more separately controlled gas outlets which correspond to the second gas outlet 10B, as described above, to provide gas flows over the support structure 13. The plural gas outlets may have substantially uniform widths. These gas outlets may be aligned with each other. These gas outlets may be aligned with the gas outlets along an edge of the patterning device 14, for example as depicted in FIG. 5. The control system 16 may be configured to control separately the gas outlets exiting gas over the support structure 13. The control system 16 may be configured to control the gas exiting each of the gas outlets over the support structure 13 at the same temperature. Alternatively, the control system 16 may be configured to control the temperature of the gas exiting each of these gas outlets at a slightly different temperature, for example to account for the thermal variation across the support structure 13.

In an embodiment, the gas outlets 10 are aligned. For example, the gas outlets 10 may be aligned along an edge of the patterning device 14. The gas outlets 10 may be arranged across the entire width of the patterning device 14 and extend further at either or both ends of the edge of the patterning device 14. As depicted in the Figures, the gas outlets 10 may be arranged such that at least one of the gas outlets 10 is arranged to be aligned i.e. parallel to, with an edge of the patterning device 14. In an embodiment, gas outlets 10 may be provided across the entire width of and either side of the patterning device 14 edge. In this way, gas flow (e.g. 12A or 120) may be provided up to the edge of the patterning device 14 over the patterning device 14 and a different gas flow (e.g. 12B or 12D) may be provided up to the edge of the patterning device 14 over the support structure 13.

In any of the above embodiments, the control system 16 may be configured to control the temperature of gas exiting each of the gas outlets 10 at a predetermined temperature. The predetermined temperature may be based on a predicted downstream temperature profile. In an embodiment, the predetermined temperature may be set at an optimum value determined for at least one of the gas outlets 10. The predetermined temperature may be set depending on the radiation beam 15 incident on the patterning device 14, for example, depending on the intensity of the radiation beam 15 across the patterning device 14.

In any of the above embodiments, the temperature of gas exiting at least one of the gas outlets may be dynamically controlled. For example, the patterning apparatus 5 may comprise a sensor system comprising at least one sensor, for example, a sensor 18 as depicted in FIG. 6. The sensor 18 may optionally be provided with the embodiment depicted in FIG. 6, and/or it may optionally be provided with any other embodiment, such as those depicted in FIG. 3 to 5 or 7. The sensor 18 may be used to determine a characteristic of the patterning apparatus 5. For example, the sensor 18 may be used to measure the temperature of the gas surrounding the sensor 18. The measurement made by the sensor 18 may be sent to the control system 16. The control system 16 may be configured to use the measurement from the sensor 18 to dynamically control the gas exiting the at least one of the gas outlets 10, for example, by adjusting if necessary the temperature of gas exiting at least one of the gas outlets 10.

Figure 7:
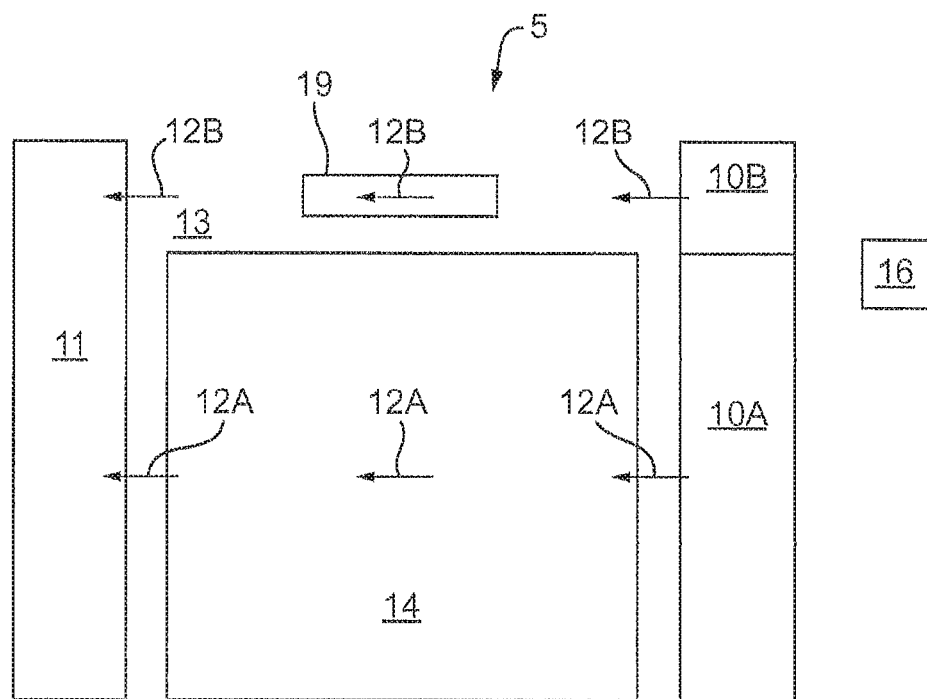
FIG. 7 is a schematic plan view illustration of a patterning apparatus, according to another embodiment.

In any of the above embodiments, the support structure 13 may be configured to support a component and/or mark of a measurement system. For example, a mark 19 may be provided on the support structure 13 as depicted in FIG. 7. The mark 19 as herein described could be a component of the measurement system, and may be the same as the object mark referred to in the description of FIG. 2, e.g. may be mask alignment marks M1 or M2. Although the mark 19 is depicted in FIG. 7, it could optionally be included in any of the embodiments described above in relation to any one of FIGS. 3 to 6. The mark 19 may be used as part of a measurement system to determine the location of the support structure 13. The relative position of the mark 19 and the patterning device 14 may be known such that the position of the mark 19 can be measured to determine the position of the patterning device 14. This allows for accurate positioning of the patterning device 14 with respect to the radiation beam 15, for example in combination with the features described in relation to FIG. 2.

However, any heating of the patterning apparatus 5 and the gas around it may lead to thermal variations which may affect the mark 19 and possibly its relative position with respect to the patterning device 14. This may lead to errors in the positioning of the patterning device 14, for example, alignment errors and/or overlay errors in the patterns formed on the substrate W as described above. Thus, it is beneficial to control the temperature of the mark 19 and its surroundings. This can be done by providing at least one gas outlet which is configured to provide a gas flow over a surface of the mark 19. As depicted in FIG. 7, the mark 19 may be provided under the second gas flow 12B from the second gas outlet 10B. Therefore, the same gas outlet may be used to provide a gas flow over the mark 19 and over the surface of the support structure 13. As described above, the temperature of gas exiting the second gas outlet 10B may be separately controlled, thus controlling thermal variation of the mark 19. This can improve thermal stability of the mark 19 and reduce the errors described.

Further parameters such as the speed of the gas over the mark 19 may be controlled as described above in relation to the second gas outlet 10B. Although the mark 19 is depicted in FIG. 7 under the second gas flow 12B, it could be located in other places on the support structure 13 and alternative or additional one of the gas outlets 10 may be used to provide a gas flow over the mark 19. The mark 19 is depicted in FIG. 7 as a rectangle, however, the shape of the mark 19 is not limiting and could be any shape which is appropriate for a mark for use in a measurement system.

In the Figures, the gas outlets 10 are shown as separate components from the support structure 13. In an embodiment, any one, or a number of, the gas outlets 10 may be integral with the support structure 13. For example, any one, or a number of, the gas outlets 10 may be provided by an opening in the support structure 13 through which the respective gas flow is provided over the patterning device 14 or support structure 13 as described above.

The above embodiments are depicted and described on the surface of the patterning device 14 on which the radiation beam 15 is incident, and the surface of the support structure 13 around the patterning device 14 (and/or recess if present) in plan view. However, the conditioning system may be applied to a different surface, for example, the other side of the support structure 13. This surface may in fact be the bottom surface of the patterning device 14 and the support structure 13. Alternatively, even when the radiation beam 15 is provided on one side of the patterning apparatus 5, the gas outlets as described in any of the above embodiments may be provided and controlled on surfaces on the other side of the patterning apparatus 5.

In some embodiments, the patterning apparatus 5 can be used in a lithographic apparatus 100 or 100' as described above with reference to FIGS. 1A and 1B. For example, the patterning apparatus 5 may be used in conjunction with lithographic apparatus 100 or 100' which includes an illuminator IL that is configured to condition a radiation beam B discussed in FIGS. 1A and 1B above.

In an embodiment, there is provided a patterning apparatus for a lithographic apparatus, the patterning apparatus comprising: a patterning device support structure configured to support a patterning device; a patterning device conditioning system comprising at least one first gas outlet configured to provide a gas flow over a surface of the patterning device and at least one second gas outlet configured to provide a gas flow over a part of a surface of the patterning device support structure not supporting the patterning device; and a control system configured to separately control the temperature of the gas exiting the first gas outlet and the temperature of the gas exiting the second gas outlet such that the temperature of the gas exiting the second gas outlet is at a higher temperature than the gas exiting the first gas outlet.

In an embodiment, there is provided a patterning apparatus for a lithographic apparatus, the patterning apparatus comprising: a patterning device support structure configured to support a patterning device; a patterning device conditioning system comprising at least one first gas outlet configured to provide a gas flow over a surface of the patterning device and at least one second gas outlet configured to provide a gas flow over a part of a surface of the patterning device support structure not supporting the patterning device; and a control system configured to control the temperature and gas flow rate of the gas exiting the first gas outlet and separately to control the temperature and gas flow rate of the gas exiting the second gas outlet.

In an embodiment, the control system is configured to control the temperature of the gas exiting the second gas outlet to be at a higher temperature than the gas exiting the first gas outlet. In an embodiment, the first gas outlet and the second gas outlet are configured such that gas in the first gas outlet is mechanically and thermally separated from gas in the second gas outlet. In an embodiment, the patterning device conditioning system comprises at least one third gas outlet configured to provide a gas flow over the patterning device, wherein the control system is further configured separately to control the temperature of the gas exiting the third gas outlet, and the control system is configured to control the temperature of gas exiting the second gas outlet to be at a higher temperature than the gas exiting the third gas outlet, and/or wherein the control system is configured to separately control the gas flow rate of the gas exiting the third gas outlet. In an embodiment, the patterning device support structure is configured to support a component and/or mark of a measurement system and at least one gas outlet is configured to provide a gas flow over a surface of the component and/or mark of the measurement system. In an embodiment, the control system is configured to control the gas flow rate at each gas outlet to provide substantially the same gas velocity at each of the first gas outlet, the second gas outlet and the third gas outlet. In an embodiment, the patterning apparatus further comprises a sensor system comprising at least one sensor, wherein the control system is configured to control the gas exiting at least one of the first gas outlet, the second gas outlet and the third gas outlet based on an output from the sensor.

In an embodiment, there is provided a lithographic apparatus comprising the patterning apparatus as described herein.

In an embodiment, there is provided a device manufacturing method using a lithographic apparatus, the method comprising: projecting a beam through a patterning device, wherein the beam is patterned by the patterning device; providing at least one first gas outlet providing a gas flow over the patterning device and at least one second gas outlet providing a gas flow over a part of a surface of the patterning device support structure not supporting the patterning device; controlling the temperature of the gas exiting the first gas outlet; separately controlling the temperature of the gas exiting the second gas outlet at a temperature higher than the temperature of gas exiting the first gas outlet; and directing the beam onto a substrate.

In an embodiment, there is provided a device manufacturing method using a lithographic apparatus, the method comprising: projecting a beam through a patterning device, wherein the beam is patterned by the patterning device; providing at least one first gas outlet providing a gas flow over a surface of the patterning device and at least one second gas outlet providing a gas flow over a part of a surface of the patterning device support structure not supporting the patterning device; controlling the temperature and gas flow rate of the gas exiting the first gas outlet; separately controlling the temperature and gas flow rate of the gas exiting the second gas outlet; and directing the beam onto a substrate.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein generally describes a material onto which subsequent material layers are added. In embodiments, the substrate itself may be patterned and materials added on top of it may also be patterned, or may remain without patterning.

While specific embodiments have been described above, it will be appreciated that the embodiments may be practiced otherwise than as described. The description is not intended to limit the invention.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the present invention and the appended claims in any way.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A patterning apparatus for a lithographic apparatus, the patterning apparatus comprising:
    a patterning device support structure configured to support a patterning device;
    a patterning device conditioning system comprising at least one first gas outlet configured to provide a gas flow over a surface of the patterning device and at least one second gas outlet configured to provide a gas flow over a part of a surface of the patterning device support structure not supporting the patterning device such that the gas flow from the second gas outlet primarily does not flow over the surface of the patterning device; and
    a control system configured to control a value of parameter of gas exiting the at least one first gas outlet to be a different value than that parameter of gas exiting the at least one second gas outlet or control a value of parameter of gas exiting the at least one second gas outlet to be a different value than that parameter of gas exiting the at least one first gas outlet.

2. The patterning apparatus according to claim 1, wherein the control system is configured to control a temperature and/or gas flow rate of gas exiting the at least one first gas outlet and/or the at least one second gas outlet.

3. The patterning apparatus according to claim 1, wherein the at least one first gas outlet and the at least one second gas outlet are configured such that gas in the at least one first gas outlet is mechanically and thermally separated from gas in the at least one second gas outlet.

4. The patterning apparatus according to claim 1, wherein the patterning device conditioning system comprises at least one third gas outlet configured to provide a gas flow over the patterning device,
    wherein the control system is further configured separately to control the temperature of the gas exiting the at least one third gas outlet, and/or
    wherein the control system is configured to control the temperature of gas exiting the at least one second gas outlet to be at a higher temperature than the gas exiting the at least one third gas outlet, and/or
    wherein the control system is configured to separately control the gas flow rate of the gas exiting the at least one third gas outlet.

5. The patterning apparatus according to claim 1, wherein the patterning device support structure is configured to support a component and/or mark of a measurement system and at least one gas outlet is configured to provide a gas flow over a surface of the component and/or mark of the measurement system.

6. The patterning apparatus according to claim 1, wherein the control system is configured to control the gas flow rate at each gas outlet to provide substantially the same gas velocity at each of the at least one first gas outlet and the at least one second gas outlet.

7. The patterning apparatus according to claim 1, further comprising a sensor system comprising at least one sensor, wherein the control system is configured to control the gas exiting the at least one first gas outlet and/or the at least one second gas outlet, based on an output from the sensor.

8. A lithographic apparatus comprising:
    the patterning apparatus of claim 1; and
    a projection system configured to project a radiation beam patterned using the patterning apparatus.

9. A patterning apparatus for a lithographic apparatus, the patterning apparatus comprising:
    a patterning device support structure configured to support a patterning device;
    a patterning device conditioning system comprising:
        at least one first gas outlet configured to provide a gas flow over a surface of the patterning device; and
        at least one second gas outlet configured to provide a gas flow over a part of a surface of the patterning device support structure not supporting the patterning device such that the gas flow from the second gas outlet primarily does not flow over the surface of the patterning device, wherein the at least one first gas outlet is independently controllable from the at least one second gas outlet.

10. The patterning apparatus according to claim 9, wherein the patterning device conditioning system is configured to control a temperature and/or a gas flow rate of gas exiting the at least one first gas outlet and/or the at least one second gas outlet.

11. The patterning apparatus according to claim 9, wherein the at least one first gas outlet and the at least one second gas outlet are configured such that gas in the at least one first gas outlet is mechanically and thermally separated from gas in the second gas outlet.

12. The patterning apparatus according to claim 9, wherein the patterning device conditioning system comprises at least one third gas outlet configured to provide a gas flow over the patterning device,
   wherein the control system is further configured separately to control the temperature of the gas exiting the third gas outlet, and/or
   wherein the control system is configured to control the temperature of gas exiting the second gas outlet to be at a higher temperature than the gas exiting the third gas outlet, and/or
   wherein the control system is configured to separately control the gas flow rate of the gas exiting the third gas outlet.

13. The patterning apparatus according to claim 9, wherein the patterning device support structure is configured to support a component and/or mark of a measurement system and at least one gas outlet is configured to provide a gas flow over a surface of the component and/or mark of the measurement system.

14. The patterning apparatus according to claim 9, wherein the patterning device conditioning system comprises at least one third gas outlet configured to provide a gas flow over the patterning device and the control system is configured to control the gas flow rate at each gas outlet to provide substantially the same gas velocity at each of the first gas outlet, the second gas outlet and the third gas outlet.

15. The patterning apparatus according to claim 9, wherein the patterning device conditioning system comprises at least one third gas outlet configured to provide a gas flow over the patterning device and further comprising a sensor system comprising at least one sensor, wherein the control system is configured to control the gas exiting at least one of the first gas outlet, the second gas outlet and the third gas outlet based on an output from the sensor.

16. A lithographic apparatus comprising:
   the patterning apparatus of claim 9; and
   a projection system configured to project a radiation beam patterned using the patterning apparatus.

17. A device manufacturing method using a lithographic apparatus, the method comprising:
   projecting a beam through a patterning device, wherein the beam is patterned by the patterning device;
   providing at least one first gas outlet providing a gas flow over a surface of the patterning device and at least one second gas outlet providing a gas flow over a part of a surface of the patterning device support structure not supporting the patterning device such that the gas flow from the second gas outlet primarily does not flow over the surface of the patterning device;
   controlling a value of parameter of gas exiting the at least one first gas outlet to be a different value than that parameter of gas exiting the at least one second gas outlet or control a value of parameter of gas exiting the at least one second gas outlet to be a different value than that parameter of gas exiting the at least one first gas outlet; and
   directing the beam onto a substrate.

18. The method according to claim 17, further comprising control a temperature and/or gas flow rate of gas exiting the at least one first gas outlet and/or the at least one second gas outlet.

19. The method according to claim 17, wherein the at least one first gas outlet and the at least one second gas outlet are configured such that gas in the at least one first gas outlet is mechanically and thermally separated from gas in the at least one second gas outlet.

20. The method according to claim 17, wherein the patterning device support structure supports a component and/or mark of a measurement system and at least one gas outlet provides a gas flow over a surface of the component and/or mark of the measurement system.

* * * * *